(12) United States Patent
Chen

(10) Patent No.: US 11,202,370 B2
(45) Date of Patent: Dec. 14, 2021

(54) INTEGRATED CIRCUIT CHIP, DISPLAY APPARATUS, AND METHOD OF FABRICATING INTEGRATED CIRCUIT CHIP

(71) Applicant: BOE Technology Group Co., Ltd., Beijing (CN)

(72) Inventor: Liqiang Chen, Beijing (CN)

(73) Assignee: BOE Technology Group Co., Ltd., Beijing (CN)

(*) Notice: Subject to any disclaimer, the term of this patent is extended or adjusted under 35 U.S.C. 154(b) by 663 days.

(21) Appl. No.: 16/081,658

(22) PCT Filed: Oct. 23, 2017

(86) PCT No.: PCT/CN2017/107325
§ 371 (c)(1),
(2) Date: Aug. 31, 2018

(87) PCT Pub. No.: WO2019/079937
PCT Pub. Date: May 2, 2019

(65) Prior Publication Data
US 2021/0212212 A1    Jul. 8, 2021

(51) Int. Cl.
*H05K 1/00*     (2006.01)
*H05K 1/18*     (2006.01)
(Continued)

(52) U.S. Cl.
CPC .......... *H05K 1/181* (2013.01); *H05K 3/4007* (2013.01); *G09F 9/301* (2013.01); *H05K 2201/10128* (2013.01)

(58) Field of Classification Search
CPC ................ H05K 1/181; H05K 3/4007; H05K 2201/1012; G09F 9/301
See application file for complete search history.

(56) References Cited

U.S. PATENT DOCUMENTS 5,851,911 A    12/1998 Farnworth
6,417,089 B1    7/2002 Kim et al.
(Continued)

FOREIGN PATENT DOCUMENTS

CN    1392607 A    1/2003
CN    101174601 A    5/2008
(Continued)

OTHER PUBLICATIONS

International Search Report & Written Opinion dated Jul. 11, 2018, regarding PCT/CN2017/107325.

*Primary Examiner* — Pete T Lee
(74) *Attorney, Agent, or Firm* — Intellectual Valley Law, P.C.

(57) ABSTRACT

The present application discloses an integrated circuit chip. The integrated circuit chip includes an integrated circuit; a bonding pad on the integrated circuit and electrically connected to the integrated circuit; a first insulating layer on a side of the bonding pad distal to the integrated circuit; and a solder bump on a side of the first insulating layer distal to the bonding pad, and electrically connected to the bonding pad. An orthographic projection of the first insulating layer on a plane containing a surface of the integrated circuit substantially covers an orthographic projection of the solder bump on the plane containing the surface of the integrated circuit.

14 Claims, 4 Drawing Sheets

(51) Int. Cl.
*H05K 3/40* (2006.01)
*G09F 9/30* (2006.01)

(56) References Cited

U.S. PATENT DOCUMENTS

| | | | | |
|---|---|---|---|---|
| 7,446,422 | B1* | 11/2008 | Paek | H01L 23/3114 |
| | | | | 257/779 |
| 8,362,612 | B1* | 1/2013 | Paek | H01L 24/05 |
| | | | | 257/737 |
| 8,993,380 | B2* | 3/2015 | Hou | H01L 21/561 |
| | | | | 438/112 |
| 9,082,776 | B2* | 7/2015 | Lu | H01L 21/56 |
| 9,401,308 | B2* | 7/2016 | Chen | H01L 24/08 |
| 9,520,333 | B1* | 12/2016 | Shih | H01L 23/49894 |
| 10,157,871 | B1* | 12/2018 | Yu | H01L 21/6835 |
| 10,297,544 | B2* | 5/2019 | Wu | H01L 24/19 |
| 2004/0191955 | A1 | 9/2004 | Joshi et al. | |
| 2005/0082685 | A1 | 4/2005 | Bojkov et al. | |
| 2007/0057370 | A1* | 3/2007 | Hashimoto | H01L 24/90 |
| | | | | 257/737 |
| 2008/0122086 | A1 | 5/2008 | Tsao et al. | |
| 2008/0251916 | A1 | 10/2008 | Cheng et al. | |
| 2015/0303159 | A1 | 10/2015 | Lin et al. | |
| 2017/0373031 | A1* | 12/2017 | Yajima | H01L 24/13 |

FOREIGN PATENT DOCUMENTS

| | | |
|---|---|---|
| CN | 102931110 A | 2/2013 |
| CN | 103247639 A | 8/2013 |

\* cited by examiner

INTEGRATED CIRCUIT CHIP, DISPLAY APPARATUS, AND METHOD OF FABRICATING INTEGRATED CIRCUIT CHIP

CROSS-REFERENCE TO RELATED APPLICATION

This application is a national stage application under 35 U.S.C. § 371 of International Application No. PCT/CN2017/107325, filed Oct. 23, 2017, the contents of which are incorporated by reference in the entirety.

TECHNICAL FIELD

The present invention relates to display technology, more particularly, to an integrated circuit chip, a display apparatus, and a method of fabricating an integrated circuit chip.

BACKGROUND

In conventional display apparatuses, an integrated circuit chip may be mounted to the display apparatus by various technique, including a chip-on-glass (COG) technique, a (COF) technique, and a chip-on-plastic (COP) technique. In the COF technique, the integrated circuit chip is mounted on a film, which then couples a flexible display apparatus and a flexible printed circuit board (FPCB). In the COP technique, the integrated circuit chip is directly mounted on a plastic base substrate of the flexible display apparatus. The COP technique does not utilize the film used in the COF technique, thereby reducing the cost.

SUMMARY

In one aspect, the present invention provides an integrated circuit chip comprising an integrated circuit; a bonding pad on the integrated circuit and electrically connected to the integrated circuit; a first insulating layer on a side of the bonding pad distal to the integrated circuit; and a solder bump on a side of the first insulating layer distal to the bonding pad, and electrically connected to the bonding pad; wherein an orthographic projection of the first insulating layer on a plane containing a surface of the integrated circuit substantially covers an orthographic projection of the solder bump on the plane containing the surface of the integrated circuit.

Optionally, the first insulating layer comprises an organic polymer material.

Optionally, the first insulating layer comprises an elastomer.

Optionally, the first insulating layer comprises a photoresist organic polyene material.

Optionally, the integrated circuit chip further comprises a passivation layer on a side of the bonding pad distal to the integrated circuit; wherein the passivation layer is on a side of the first insulating layer proximal to the integrated circuit.

Optionally, the passivation layer comprising an inorganic insulating material.

Optionally, the orthographic projection of the solder hump on the plane containing the surface of the integrated circuit is substantially outside an orthographic projection of the bonding pad on the plane containing the surface of the integrated circuit.

Optionally, the integrated circuit chip further comprises a first conductive layer on a side of the first insulating layer and the passivation layer distal to the integrated circuit, and connecting the bonding pad and the solder bump; and a first via extending through the first insulating layer and the passivation layer, wherein the first conductive layer extends through the first via to be electrically connected to the bonding pad.

Optionally, the integrated circuit chip further comprises an under-bump metallization structure between the solder bump and the first conductive layer, and electrically connecting the solder bump and the first conductive layer; and an orthographic projection of the under-bump metallization structure on the plane containing the surface of the integrated circuit is substantially outside the orthographic projection of the bonding pad on the plane containing the surface of the integrated circuit.

Optionally, a side surface of a portion of the first via extending through the first insulating layer has a slope angle no more than approximately 45 degrees.

Optionally, the first insulating layer has a thickness in a range of approximately 1 grin to approximately 5 μm.

Optionally, the orthographic projection of the solder bump on the plane containing the surface of the integrated circuit at least partially overlaps with an orthographic projection of the bonding pad on the plane containing the surface of the integrated circuit.

Optionally, the orthographic projection of the first insulating layer on the plane containing the surface of the integrated circuit substantially covers the orthographic projection of the bonding pad on the plane containing the surface of the intergrated circuit.

Optionally, the integrated circuit chip further comprises a first conductive layer on a side of the passivation layer distal to the integrated circuit and on a side of the first insulating layer proximal to the integrated circuit; a second conductive layer on a side of the first insulating layer distal to the integrated circuit and on a side of the solder bump proximal to the integrated circuit, and electrically connected to the solder bump; a first via extending through the passivation layer; and a second via extending through the first insulating layer; wherein the first conductive layer extends through the first via to be connected to the bonding pad; the second conductive layer extends through the second via to be connected to the first conductive layer; and the first conductive layer and the second conductive layer connect the bonding pad to the solder bump.

Optionally, the integrated circuit chip further comprises a second insulating layer on a side of the first conductive layer proximal to the integrated circuit and on a side of the passivation layer distal to the integrated circuit; wherein the first via extends through the second insulating layer and the passivation layer.

Optionally, the second insulating layer is made of a same material as the first insulating layer.

Optionally, a side surface of a portion of the first via extending through the second insulating layer has a slope angle no more than approximately 45 degrees.

Optionally, the integrated circuit chip further comprises an under-bump metallization structure between the solder bump and the second conductive layer, and electrically connecting the solder bump and the second conductive layer; and an orthographic projection of the under-bump metallization structure on the plane containing the surface of the integrated circuit at least partially overlaps with the orthographic projection of the bonding pad on the plane containing the surface of the integrated circuit.

Optionally, the second insulating layer has a thickness in a range of approximately 1 μm to approximately 5 μm.

In another aspect, the present invention provides a display apparatus comprising the integrated circuit chip described herein or fabricated by a method described herein.

Optionally, the display apparatus is a flexible display apparatus.

Optionally, the integrated circuit chip is attached to the flexible display apparatus by a chip-on-plastic-type connection.

In another aspect, the present invention provides a method of fabricating an integrated circuit chip, comprising forming a bonding pad on an integrated circuit and electrically connected to the integrated circuit; forming a first insulating layer on a side of the bonding pad distal to the integrated circuit; and forming a solder bump on a side of the first insulating layer distal to the bonding pad, and electrically connected to the bonding pad; wherein the first insulating layer and the solder bump are formed so that an orthographic projection of the first insulating layer on a plane containing a surface of the integrated circuit substantially covers an orthographic projection of the solder bump on the plane containing the surface of the integrated circuit.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the Mowing embodiments. It is to be noted that the following descriptions of some embodiments are presented herein for purpose of illustration and description only. It is not intended to be exhaustive or to be limited to the precise form disclosed.

In conventional flexible display apparatus, the integrated circuit chip is typically bonded to the display apparatus by a chip-on-film-type connection. The chip-on-film used in conventional flexible display apparatus requires a relatively high fabricating cost. Moreover, the metal wires in the chip-on-film cannot be made ultra-thin, making the application of chip-on-film in high-resolution display apparatuses very difficult. To overcome this problem, a chip-on-plastic-type connection is developed to attach the integrated circuit chip directly on the flexible base substrate of the display apparatus.

Figure 1:
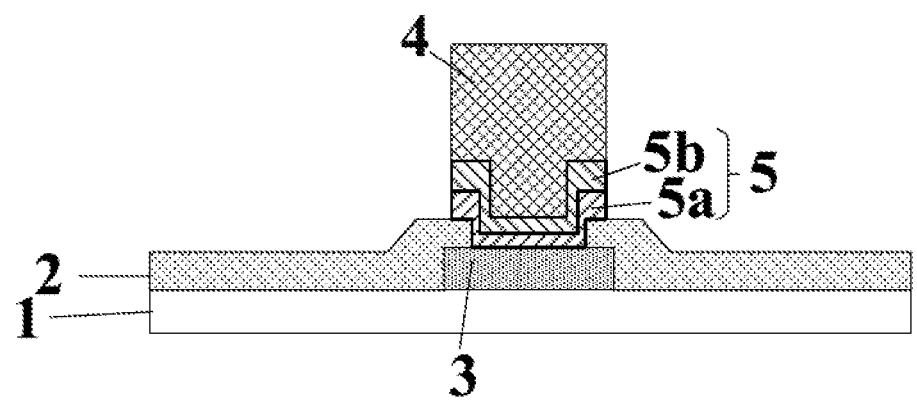
FIG. 1 is a schematic diagram illustrating the structure of an integrated circuit chip in some embodiments according to the present disclosure.

FIG. 1 is a schematic diagram illustrating the structure of an integrated circuit chip in some embodiments according to the present disclosure. Referring to FIG. 1, the integrated circuit chip in some embodiments includes an integrated circuit 1, a bonding pad 3 on the integrated circuit 1, a passivation layer 2 on a side of the bonding pad 3 distal to the integrated circuit 1, an under-bump metallization structure 5 on a side of the bonding pad 3 distal to the integrated circuit 1, and a solder bump 4 on a side of the under-bump metallization structure 5 distal to the bonding pad 3. The under-bump metallization structure 5 may include a plurality of sub-layers. As shown in FIG. 1, the under-bump metallization structure 5 in some embodiments includes a first sub-layer 5a and a second sub-layer 5b. Optionally, the first sub-layer 5a is made of one or a combination of a metallic material such as titanium, tungsten, titanium-tungsten alloy, and chromium. Optionally, the second sub-layer 5b is made of a material substantially the same as that of the solder bump 4.

In the integrated circuit chip of FIG. 1, the integrated circuit 1, the bonding pad 3, the solder bump 4 are aligned together. When the integrated circuit chip of FIG. 1 is attached to the flexible display apparatus, the solder bump 4 is pressed against a bonding pad in the flexible display apparatus to be electrically connected to the bonding pad in the flexible display apparatus. The process of attaching the integrated circuit chip to the flexible display apparatus creates a stress along the direction from the bonding pad in the flexible display apparatus to the solder bump 4, the bonding pad 3, and the integrated circuit 1. As shown in FIG. 1, the layers along the direction of the stress are all layers made of rigid material such as a metal material. Often the stress along this direction is large enough to break the bonding pad in the flexible display apparatus, resulting in open circuit.

Accordingly, the present disclosure provides, inter WO, an integrated circuit chip, a display apparatus, and a method of fabricating an integrated circuit chip that substantially obviate one or more of the problems due to limitations and disadvantages of the related art. In one aspect, the present disclosure provides an integrated circuit chip. In some embodiments, the integrated circuit chip includes an integrated circuit; a bonding pad on the integrated circuit and electrically connected to the integrated circuit; a first insulating layer on a side of the bonding pad distal to the integrated circuit; and a solder bump on a side of the first insulating layer distal to the bonding pad, and electrically connected to the bonding pad. Optionally, an orthographic projection of the first insulating layer on a plane containing a surface of the integrated circuit substantially covers an orthographic projection of the solder bump on the plane containing the surface of the integrated circuit. When the present integrated circuit chip is attached to a display apparatus, the solder bump is pressed against bonding pad in the display apparatus, and a stress is generated along the direction from the bonding pad in the display apparatus to the solder bump. By having a first insulating layer in the present integrated circuit, the stress can be effectively dissipated and buffered, obviating the issue of open circuit in the display apparatus during the integrated circuit chip attachment process.

Figure 2:
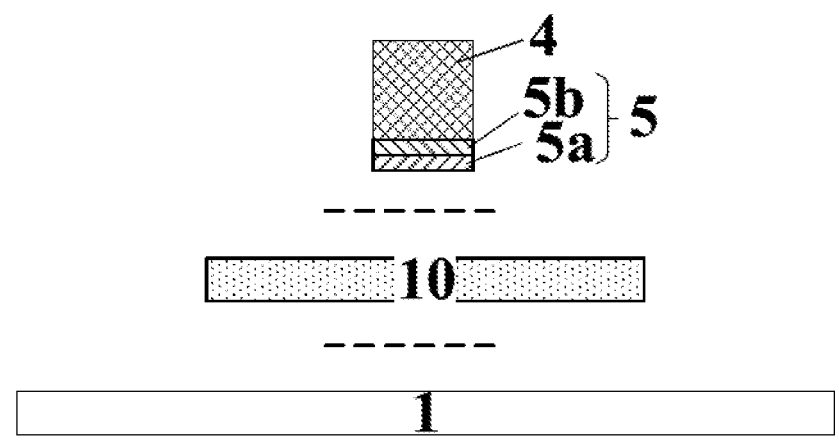
FIG. 2 is a schematic diagram illustrating the structure of an integrated circuit chip in some embodiments according to the present disclosure.

FIG. 2 is a schematic diagram illustrating the structure of an integrated circuit chip in some embodiments according to the present disclosure. Referring to FIG. 2, the integrated circuit chip in some embodiments includes an integrated circuit 1; a solder bump 4; and a first insulating layer 10 between the integrated circuit 1 and the solder bump 4. As shown in FIG. 2, an orthographic projection of the first insulating layer 10 on a plane containing a surface of the integrated circuit 1 substantially covers an orthographic projection of the solder bump 4 on the plane containing the surface of the integrated circuit 1. By having this design, the stress created during the attachment process can be effectively dissipated and buffered by the first insulating layer 10, avoiding damages on the bonding pad in the display apparatus.

Various appropriate materials may be used for making the first insulating layer 10. In some embodiments, the first insulating layer 10 includes an organic polymer material. Optionally, the first insulating layer 10 includes a flexible organic polymer material. Optionally, the first insulating layer 10 is made of a material having a relatively low thermal expansion coefficient. Optionally, the first insulating layer 10 is made of a material having a relatively low Young's modulus. Optionally, the first insulating layer 10 includes an elastomer (e.g., viscoelastic polymers) such as polyimides, polysilicones, polysiloxanes, rubbers, urethane polyimides, polyepoxides, and so on. Optionally, the first insulating layer 10 is made of a photoresist organic polymer material, e.g., a photoresist elastomer, in one example, the first insulating layer 10 is made of a photoresist polyimide material.

Figure 3:
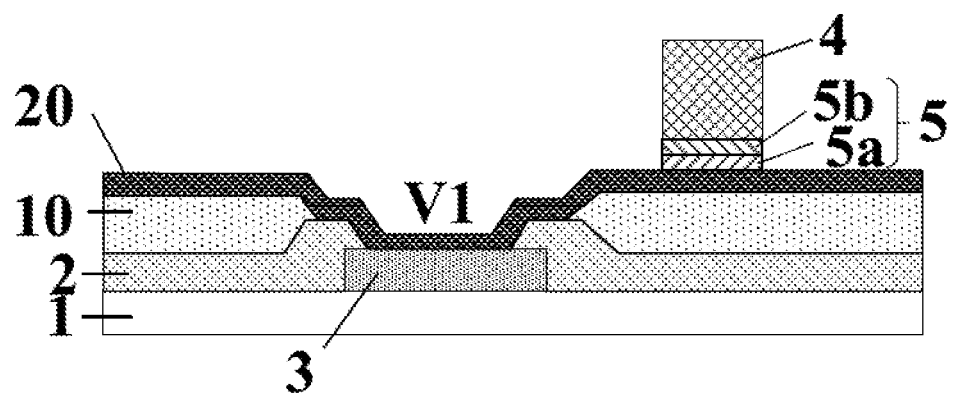
FIG. 3 is a schematic diagram illustrating the structure of an integrated circuit chip in some embodiments according to the present disclosure.

FIG. 3 is a schematic diagram illustrating the structure of an integrated circuit chip in some embodiments according to the present disclosure, Referring to FIG. 3, the integrated circuit chip in some embodiments includes an integrated circuit 1, a bonding pad 3 on the integrated circuit 1 and electrically connected to the integrated circuit 1, a passivation layer 2 on a side of the bonding pad 3 distal to the integrated circuit 1, a first insulating layer 10 on a side of the passivation layer 2 distal to the integrated circuit 1, and a solder bump 4 on a side of the first insulating layer 10 distal to the integrated circuit 1. Optionally, the passivation layer 2 is made of an inorganic insulating material such as silicon dioxide and silicon nitride.

As shown in FIG. 3, in some embodiments, the orthographic projection of the solder bump 4 on the plane containing the surface of the integrated circuit 1 is substantially outside an orthographic projection of the bonding pad 3 on the plane containing the surface of the integrated circuit 1, at the same time, the orthographic projection of the first insulating layer 10 on a plane containing the surface of the integrated circuit 1 substantially covers an orthographic projection of the solder bump 4 on the plane containing the surface of the integrated circuit 1. By having this design, the bonding pad 3 is outside the region in which stress is generated during the process of attaching the integrated circuit chip to the display apparatus. In the region in which stress is generated, the first insulating layer 10 is sandwiched between the solder bump 4 and the integrated circuit 1, effectively buffering and dissipating the stress.

In some embodiments, the integrated circuit chip further includes a first conductive layer 20 on a side of the first insulating layer 10 and the passivation layer 2 distal to the integrated circuit 1. The first conductive layer 20 electrically connects the bonding pad 3 and the solder bump 4. Various appropriate conductive materials may be used for making the first conductive layer 20. Examples of conductive materials suitable for making the first conductive layer 20 include metals (e.g., aluminum, copper, gold), alloys, metal oxides, carbon nanotubes, graphenes, and so on. Optionally, the first conductive layer 20 is a metal wire.

Optionally, the first conductive layer 20 has a thickness in a range of approximately 1 µm to approximately 5 µm.

In some embodiments, the integrated circuit chip further includes a first via V1 extending through the first insulating layer 10 and the passivation layer 2. The first conductive layer 20 extends through the first via V1 to be electrically connected to the bonding pad 3, which in turn is electrically connected to the integrated circuit 1.

Figure 4:
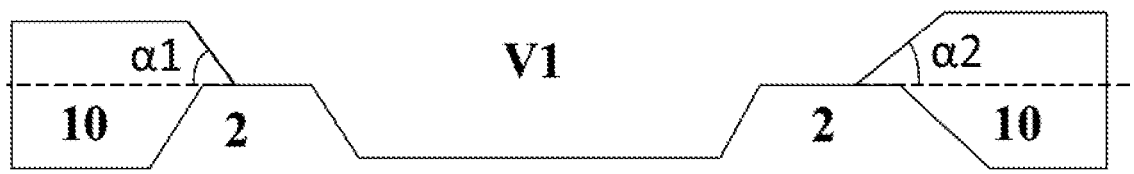
FIG. 4 is a schematic diagram illustrating a first via in an integrated, circuit chip in some embodiments according to the present disclosure.
Figure 5:
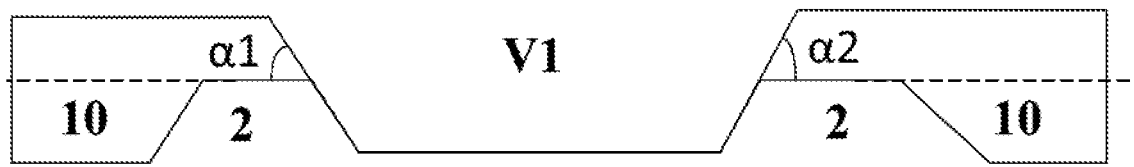
FIG. 5 is a schematic diagram illustrating a first via in an integrated circuit chip in some embodiments according to the present disclosure.

FIG. 4 is a schematic diagram illustrating a first via in an integrated circuit chip in some embodiments according to the present disclosure, Referring to FIG. 4, the first via V1 extends through the first insulating layer 10 and the passivation layer 2 in a step-wise fashion. Optionally, a side surface of a portion of the first via V1 extending through the first insulating layer 10 has a slope angle no more than approximately 45 degrees. For example, each of the angle α1 and α2 is no more than approximately 45 degrees. By having this design, the slope in the first via V1 is not too steep for the first conductive layer 20 to pass through, avoiding issues such as line open in the first conductive layer 20. FIG. 5 is a schematic diagram illustrating a first via in an integrated circuit chip in some embodiments according to the present disclosure. Referring to FIG. 5, the first via V1 extends through the first insulating layer 10 and the passivation layer 2 substantially smoothly, e.g., without any steps between a region corresponding to the first insulating layer 10 and a region corresponding to the passivation layer 2. Optionally, a side surface of the first via V1 has a slope angle no more than approximately 45 degrees. For example, each of the angle α1 and α2 is no more than approximately 45 degrees.

In some embodiments, the integrated circuit chip further includes an under-bump metallization structure 5 between the solder bump 4 and the first conductive layer 20. The under-bump metallization structure 5 electrically connect the solder bump 4 and the first conductive layer 20, Optionally, an orthographic projection of the under-bump metallization structure 5 on the plane containing the surface of the integrated circuit 1 is substantially outside the orthographic projection of the bonding pad 3 on the plane containing the surface of the integrated circuit 1.

In some embodiments, the under-bump metallization structure 5 includes a first sub-layer 5a and a second sub-layer 5b. Various appropriate conductive materials may be used for making the under-bump metallization structure 5. Optionally, the first sub-layer 5a is made of one or a combination of a metallic material such, as titanium, tungsten, titanium-tungsten alloy, and chromium. Optionally, the second sub-layer 5b is made of a material substantially the same as that of the solder bump 4.

Figure 6:
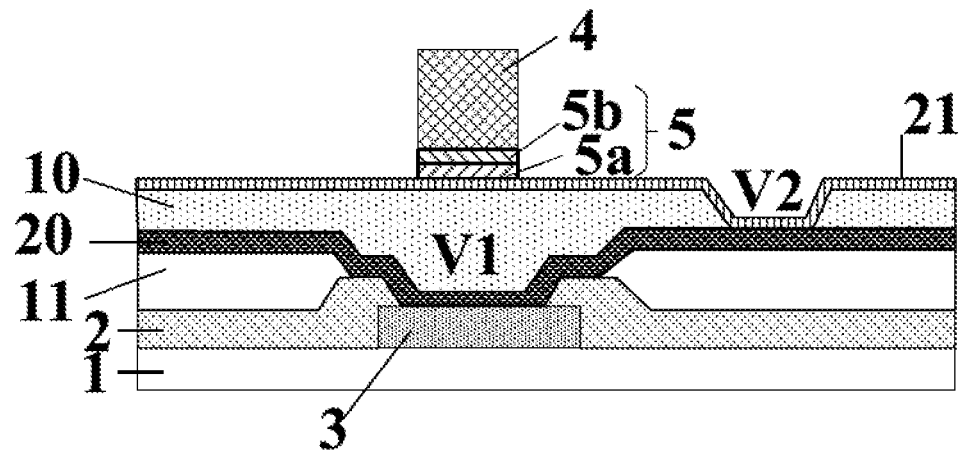
FIG. 6 is a schematic diagram illustrating the structure of an integrated circuit chip in some embodiments according to the present disclosure.

FIG. 6 is a schematic diagram illustrating the structure of an integrated circuit chip in some embodiments according to the present disclosure. Referring to FIG. 6, the integrated circuit chip in some embodiments includes an integrated circuit 1, a bonding pad 3 on the integrated circuit 1 and electrically connected to the integrated circuit 1, a passivation layer 2 on a side of the bonding pad 3 distal to the integrated circuit 1, a second insulating layer 11 on a side of the passivation layer 2 distal to the integrated circuit 1, a first insulating layer 10 on a side of the second insulating layer 11 distal to the integrated circuit 1, and a solder bump 4 on a side of the first insulating layer 10 distal to the integrated circuit 1. Optionally, the passivation layer 2 is made of an inorganic insulating material such as silicon dioxide and silicon nitride.

As shown in FIG. 6, in some embodiments, the orthographic projection of the solder bump 4 on the plane containing the surface of the integrated circuit 1 at least partially overlaps with an orthographic projection of the bonding pad 3 on the plane containing the surface of the integrated circuit 1, at the same time, the orthographic projection of the first insulating layer 10 on a plane containing the surface of the integrated circuit 1 substantially covers an orthographic projection of the solder bump 4 on the plane containing the surface of the integrated circuit 1. In this example, even though the bonding pad 3 is still aligned with the solder bump 4, the first insulating layer 10 is disposed between the solder bump 4 and the bonding pad 3 and the underlying integrated circuit 1 to buffer and dissipate the stress generated during the process of attaching the integrated circuit chip to the display apparatus. The orthographic projection of the first insulating layer 10 on the plane containing the surface of the integrated circuit 1 not only covers the orthographic projection of solder bump 4 on the plane containing the surface of the integrated circuit 1, but also covers the orthographic projection of the bonding pad 3 on the plane containing the surface of the integrated circuit 1. By having this design, the stress generated during the process of attaching the integrated circuit chip to the display apparatus can be effectively buffered and dissipated by the first insulating layer 10.

Various appropriate materials may be used for making the first insulating layer 10 and the second insulating layer 11. In some embodiments, each of the first insulating layer 10 and the second insulating layer 11 includes an organic polymer material. Optionally, each of the first insulating layer 10 and the second insulating layer 11 includes a flexible organic polymer material. Optionally, each of the first insulating layer 10 and the second insulating layer 11 is made of a material having a relatively low thermal expansion coefficient. Optionally, each of the first insulating layer 10 and the second insulating layer 11 is made of a material having a relatively low Young's modulus. Optionally, each of the first insulating layer 10 and the second insulating layer 11 includes an elastomer (e.g., viscoelastic polymers) such as polyimides, polysilicones, polysiloxanes, rubbers, urethane polyimides, polyepoxides, and so on. Optionally, each of the first insulating layer 10 and the second insulating layer 11 is made of a photoresist organic polymer material, e.g., a photoresist elastomer. In one example, each of the first insulating layer 10 and the second insulating layer 11 is made of a photoresist polyimide material, Optionally, the first insulating layer 10 and the second insulating layer 11 are made of a same material. Optionally, the first insulating layer 10 and the second insulating layer 11 are made of different materials.

In some embodiments, to electrically connect the bonding pad 3 and the solder bump 4, the integrated circuit chip further includes a first conductive layer 20 and a second conductive layer 21. The first conductive layer 20 is on a side of the passivation layer 2 distal to the integrated circuit 1, and on a side of the first insulating layer 10 proximal to the integrated circuit 1. The second conductive layer 21 is on a side of the first insulating layer 10 distal to the integrated circuit 1, and on a side of the solder bump 4 proximal to the integrated circuit 1. The first conductive layer 20 is electrically connected to the bonding pad 3. The second conductive layer 21 is electrically connected to the solder bump 4.

Various appropriate conductive materials may be used for making the first conductive layer 20. Examples of conductive materials suitable fib making the first conductive layer 20 include metals (e.g., aluminum, copper, gold), alloys, metal oxides, carbon nanotubes, graphenes, and so on. Optionally, the first conductive layer 20 is a metal wire.

Various appropriate conductive materials may be used for making the second conductive layer 21. Examples of conductive materials suitable for making the second conductive layer 21 include metals (e.g., aluminum, copper, gold), alloys, metal oxides, carbon nanotubes, graphemes, and so on. Optionally, the second conductive layer 21 is a metal wire.

Optionally, the first conductive layer 20 has a thickness in a range of approximately 1 μm to approximately 5 μm.

Optionally, the second conductive layer 21 has a thickness in a range of approximately 1 μm to approximately 5 μm.

In some embodiments, the integrated circuit chip further includes a first via V1 extending through the second insulating layer 11 and the passivation layer 2, and a second via V2 extending through the first insulating layer 10. The first conductive layer 20 extends through the first via V1 to be connected to the bonding pad 3. The second conductive layer 21 extends through the second via V2 to be connected to the first conductive layer 20. Together, the first conductive layer 20 and the second conductive layer 21 connect the bonding pad 3 to the solder bump 4.

Figure 7:
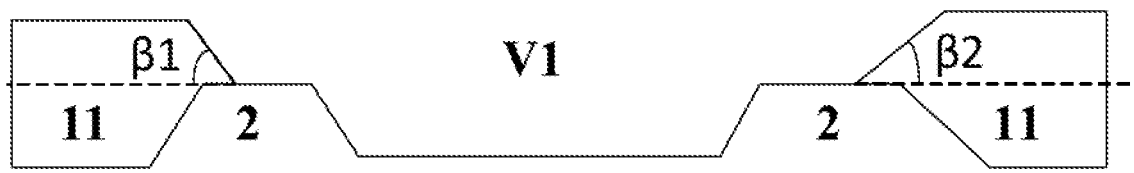
FIG. 7 is a schematic diagram illustrating a first via in an integrated circuit chip in some embodiments according to the present disclosure.
Figure 8:
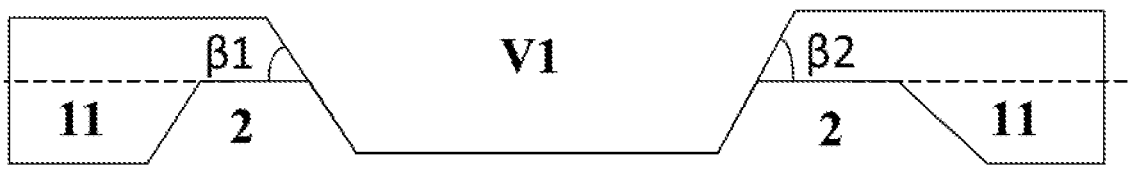
FIG. 8 is a schematic diagram illustrating a first via in an integrated circuit chip in some embodiments according to the present disclosure.

FIG. 7 is a schematic diagram illustrating a first via in an integrated circuit chip in some embodiments according to the present disclosure. Referring to FIG. 7, the first via V1 extends through the second insulating layer 11 and the passivation layer 2 in a step-wise fashion. Optionally, a side surface of a portion of the first via V1 extending through the second insulating layer 11 has a slope angle no more than approximately 45 degrees. For example, each of the angle β1 and β2 is no more than approximately 45 degrees. By having this design, the slope in the first via V1 is not too steep for the first conductive layer 20 to pass through, avoiding issues such as line open in the first conductive layer 20. FIG. 8 is a schematic diagram illustrating a first via in an integrated circuit chip in some embodiments according to the present disclosure. Referring to FIG. 8, the first via V1 extends through the second insulating layer 11 and the passivation layer 2 substantially smoothly, e.g., without any steps between a region corresponding to the second insulating layer 11 and a region corresponding to the passivation layer 2. Optionally, a side surface of the first via V1 has a slope angle no more than approximately 45 degrees. For example, each of the angle β1 and β2 is no more than approximately 45 degrees.

Figure 9:
FIG. 9 is a schematic diagram illustrating a second via in an integrated circuit chip in some embodiments according to the present disclosure.

FIG. 9 is a schematic diagram illustrating a second via in an integrated circuit chip in some embodiments according to the present disclosure. Referring to FIG. 9, the second via V2 extends through the first insulating layer 10. Optionally, a side surface of the second via V2 has a slope angle no more than approximately 45 degrees. For example, each of the angle γ1 and γ2 is no more than approximately 45 degrees.

In some embodiments, the integrated circuit chip further includes an under-bump metallization structure 5 between the solder bump 4 and the second conductive layer 21. The under-bump metallization structure 5 electrically connect the solder bump 4 and the second conductive layer 21. Optionally, an orthographic projection of the under-bump metallization structure 5 on the plane containing the surface of the integrated circuit 1 at least partially overlaps with the orthographic projection of the bonding pad 3 on the plane containing the surface of the integrated circuit 1. Optionally, the orthographic projection of the under-bump metallization structure 5 on the plane containing the surface of the integrated circuit 1 substantially completely overlaps with the orthographic projection of the bonding pad 3 on the plane containing the surface of the integrated circuit 1. Optionally, the orthographic projection of the bonding pad 3 on the plane containing the surface of the integrated circuit 1 substantially covers the orthographic projection of the under-bump metallization structure 5 on the plane containing the surface of the integrated circuit 1.

In some embodiments, the under-bump metallization structure 5 includes a first sub-layer 5a and a second sub-layer 5b. Various appropriate conductive materials may be used for making the under-bump metallization structure 5. Optionally, the first sub-layer 5a is made of one or a combination of a metallic material such as titanium, tungsten, titanium-tungsten alloy, and chromium. Optionally, the second sub-layer 5b is made of a material substantially the same as that of the solder bump 4.

Various appropriate conductive materials may be used for making the solder bump 4. Examples of conductive materials suitable for making the solder bump 4 include various metals and various alloys, e.g., gold, tin, lead-tin alloy, tin-silver alloy, tin-silver-bismuth alloy, tin-silver-bismuth-copper alloy, tin-silver-bismuth-copper-germanium alloy, tin-silver-copper alloy, tin-bismuth alloy, tin-copper alloy, tin-zinc alloy, and so on.

Various appropriate conductive materials may be used for making the bonding pad 3. Examples of conductive materials suitable for making the bonding pad 3 include various metals and various alloys, e.g., aluminum, an aluminum alloy such as an aluminum-copper alloy.

In another aspect, the present disclosure provides a display apparatus having an integrated circuit chip described herein or fabricated by a method described herein. Optionally, the display apparatus is a flexible display apparatus. Optionally, the integrated circuit chip is attached to the flexible display apparatus by a chip-on-plastic-type connection, in which the integrated circuit chip is directly mounted on a flexible base substrate of the flexible display apparatus. Optionally, the integrated circuit chip is attached to the flexible display apparatus by a chip-on-glass-type connection. Optionally, the integrated circuit chip is attached to the flexible display apparatus by a chip-on-film-type connection.

Figure 10:
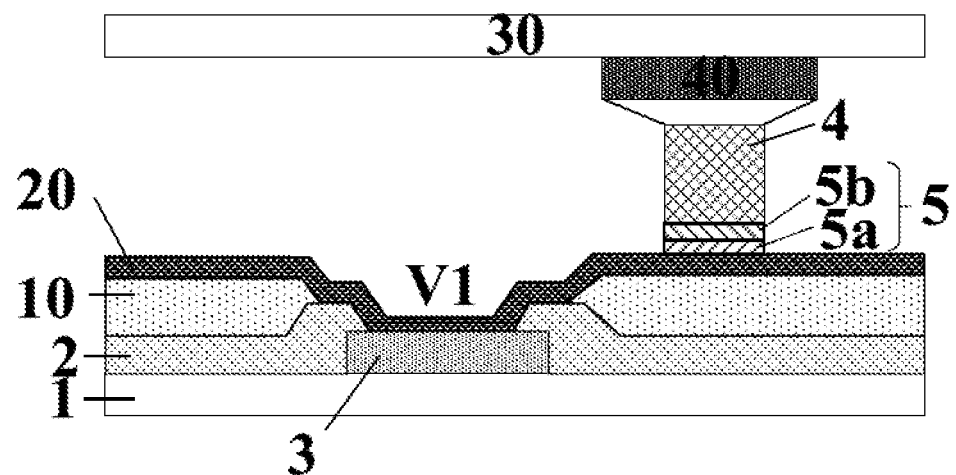
FIG. 10 is a schematic diagram illustrating attachment of an integrated circuit chip to a display apparatus in some embodiments according to the present disclosure.

FIG. 10 is a schematic diagram illustrating attachment of an integrated circuit chip to a display apparatus in some embodiments according to the present disclosure. Referring to FIG. 10, the display apparatus is a flexible display apparatus, and the integrated circuit: chip is attached to the flexible display apparatus by a chip-on-plastic-type connection. The flexible display apparatus includes a flexible base substrate 30 and a bonding pad 40 in a peripheral area of the flexible display apparatus. In the process of attaching the integrated circuit chip to the flexible display apparatus, the solder bump 4 is pressed against the bonding pad 40 on the flexible base substrate 30.

In another aspect, the present disclosure provides a method of fabricating an integrated circuit chip. In some embodiments, the method includes forming a bonding pad on an integrated circuit: and electrically connected to the integrated circuit; forming a first insulating layer on a side of the bonding pad distal to the integrated circuit; and forming a solder bump on a side of the first insulating layer distal to the bonding pad, and electrically connected to the bonding pad. Optionally, the first insulating layer and the solder bump are formed so that an orthographic projection of the first insulating layer on a plane containing a surface of the integrated circuit substantially covers an orthographic projection of the solder bump on the plane containing the surface of the integrated circuit.

In some embodiments, the step of formula the first insulating layer includes forming a photoresist organic polymer material layer on the integrated circuit, patterning the photoresist organic polymer material layer using a mask plate having a pattern corresponding to that of the first insulating layer, and curing the patterned photoresist organic polymer material layer, thereby forming the first insulating layer. Optionally, the photoresist organic polymer material is a photoresist elastomer, e.g., a photoresist polyimide.

In, some embodiments, the method further includes forming a passivation layer on a side of the bonding pad distal to the integrated circuit, the passivation layer is formed on a side of the first insulating layer proximal to the integrated circuit. Optionally, the step of forming the passivation layer is performed subsequent to the step of forming the bonding pad and prior to the step of forming the first insulating layer. Optionally, the passivation layer is formed using an inorganic insulating material such as silicon dioxide and silicon nitride.

In some embodiments, the solder bump and the bonding pad are formed so that the orthographic projection of the solder bump on the plane containing the surface of the integrated circuit is substantially outside an orthographic projection of the bonding pad on the plane containing the surface of the integrated circuit.

In some embodiments, the method further includes forming a first conductive layer on a side of the first insulating layer and the passivation layer distal to the integrated circuit, and formed to connect the bonding pad and the solder bump. Optionally, the method further includes forming a first via extending through the first insulating layer and the passivation layer. Optionally, the first conductive layer is formed to extend through the first via to be electrically connected to the bonding pad.

In some embodiments, the method further includes forming an under-bump metallization structure between the solder bump and the first conductive layer, and formed to electrically connect the solder bump and the first conductive layer. Optionally, an orthographic projection of the under-bump metallization structure on the plane containing the surface of the integrated circuit is substantially outside the orthographic projection of the bonding pad on the plane containing the surface of the integrated circuit.

Optionally, the first via is formed so that a side surface of a portion of the first via extending through the first insulating layer has a slope angle no more than approximately 45 degrees.

Optionally, the first insulating layer is formed to have a thickness in a range of approximately 1 to approximately 5 μm.

In some embodiments, the solder bump and the bonding pad are formed so that the orthographic projection of the solder bump on the plane containing the surface of the integrated circuit at least partially overlaps with an orthographic projection of the bonding pad on the plane containing the surface of the integrated circuit Optionally, the orthographic projection of the first insulating layer on the plane containing the surface of the integrated circuit substantially covers the orthographic projection of the bonding pad on the plane containing the surface of the integrated circuit.

In some embodiments, the method further includes forming a first conductive layer on a side of the passivation layer distal to the integrated circuit and on a side of the first insulating layer proximal to the integrated circuit; and forming a second conductive layer on a side of the first insulating layer distal to the integrated circuit and on a side of the solder bump proximal to the integrated circuit, and electrically connected to the solder bump. Optionally, the method further includes forming a first via extending through the passivation layer: and forming a second via extending through the first insulating layer. Optionally, the first conductive layer is formed to extend through the first via to be connected to the bonding pad. Optionally, the second conductive layer is formed to extend through the second via to be connected to the first conductive layer. Optionally, the first conductive layer and the second conductive layer are formed to connect the bonding pad to the solder hump.

In some embodiments, the method further includes forming a second insulating layer on a side of the first conductive layer proximal to the integrated circuit and on a side of the passivation layer distal to the integrated circuit. Optionally, the first via is formed to extend through the second insulating layer and the passivation layer. Optionally, the second insulating layer is made of a same material as the first insulating layer.

Optionally, a side surface of a portion of the first via extending through the second insulating layer has a slope angle no more than approximately 45 degrees. Optionally, a side surface of a portion of the second via extending through the first insulating layer has a slope angle no more than approximately 45 degrees.

Optionally, the first insulating layer is formed to have a thickness in a range of approximately 1 μm to approximately 5 μm. Optionally, the second insulating layer is formed to have a thickness in a range of approximately 1 μm to approximately 5 μm.

In some embodiments, the method further includes thrilling an under-bump metallization structure between the solder bump and the second conductive layer, and formed to electrically connect the solder bump and the second conductive layer. Optionally, the under-bump metallization structure and the bonding pad are formed so that an orthographic projection of the under-bump metallization structure on the plane containing the surface of the integrated circuit at least partially overlaps with the orthographic projection of the bonding pad on the plane containing the surface of the integrated circuit.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. An integrated circuit chip, comprising:
   an integrated circuit;
   a bonding pad on the integrated circuit and electrically connected to the integrated circuit;
   a passivation layer on a side of the bonding pad away from the integrated circuit;
   a second insulating layer on a side of the passivation layer away from the integrated circuit;
   a first conductive layer on a side of the passivation layer and the second insulating layer away from the integrated circuit;
   a first insulating layer on a side of the first conductive layer away from the bonding pad;
   a second conductive layer on a side of the first insulating layer away from the first conductive layer, wherein the first insulating layer and the second insulating layer comprise a same organic polymer material;
   an under-bump metallization structure on a side of the second conductive layer away from the first insulating layer;
   a solder bump on a side of the under-bump metallization structure away from the second conductive layer;
   a first via extending through the passivation layer and the second insulating layer, the first conductive layer extending through the first via to be connected to the bonding pad; and
   a second via extending through the first insulating layer, the second conductive layer extends through the second via to be connected to the first conductive layer;
   wherein an orthographic projection of the first insulating layer on a plane containing a surface of the integrated circuit substantially covers an orthographic projection of the solder bump on the plane containing the surface of the integrated circuit;
   the passivation layer is in direct contact with the bonding pad, in direct contact with second insulating layer, and in direct contact with the first conductive layer;
   the under-bump metallization structure is in direct contact with the solder bump and in direct contact with the second conductive layer; and
   the second conductive layer is in direct contact with the first insulating layer and in direct contact with the under-bump metallization structure.

2. The integrated circuit chip of claim 1, wherein an orthographic projection of the solder bump on the plane containing the surface of the integrated circuit is nonoverlapping with an orthographic projection of the second via on the plane containing the surface of the integrated circuit.

3. The integrated circuit chip of claim 1, wherein the first insulating layer comprises a photoresist organic polymer material.

4. The integrated circuit chip of claim 1, wherein a side surface of a portion of the first via extending through the first insulating layer has a slope angle no more than approximately 45 degrees.

5. The integrated circuit chip of claim 1, wherein the first insulating layer has a thickness in a range of approximately 1 µm to approximately 5 µm.

6. The integrated circuit chip of claim 1, wherein the orthographic projection of the solder bump on the plane containing the surface of the integrated circuit at least partially overlaps with an orthographic projection of the bonding pad on the plane containing the surface of the integrated circuit.

7. The integrated circuit chip of claim 1, wherein the orthographic projection of the first insulating layer on the plane containing the surface of the integrated circuit substantially covers the orthographic projection of the bonding pad on the plane containing the surface of the integrated circuit.

8. The integrated circuit chip of claim 1, wherein the second insulating layer is made of a same material as the first insulating layer.

9. The integrated circuit chip of claim 1, wherein a side surface of a portion of the first via extending through the second insulating layer has a slope angle no more than approximately 45 degrees.

10. The integrated circuit chip of claim 1
wherein an orthographic projection of the under-bump metallization structure on the plane containing the surface of the integrated circuit at least partially overlaps with the orthographic projection of the bonding pad on the plane containing the surface of the integrated circuit.

11. The integrated circuit chip of claim 1, wherein the second insulating layer has a thickness in a range of approximately 1 µm to approximately 5 µm.

12. A display apparatus, comprising the integrated circuit chip of claim 1.

13. The display apparatus of claim 1, wherein the integrated circuit chip is attached to the display apparatus by a chip-on-plastic-type connection.

14. A method of fabricating an integrated circuit chip, comprising:
forming a bonding pad on an integrated circuit and electrically connected to the integrated circuit;
forming a passivation layer on a side of the bonding pad away from the integrated circuit;
forming a second insulating layer on a side of the passivation layer away from the integrated circuit;
forming a first conductive layer on a side of the passivation layer and the second insulating layer away from the integrated circuit;
forming a first insulating layer on a side of the first conductive layer away from the bonding pad; and
forming a second conductive layer on a side of the first insulating layer away from the first conductive layer, wherein the first insulating layer and the second insulating layer comprise a same organic polymer material;
forming an under-bump metallization structure on a side of the second conductive layer away from the first insulating layer;
forming a solder bump on a side of the under-bump metallization structure away from the second conductive layer;
forming a first via extending through the passivation layer and the second insulating layer, the first conductive layer extending through the first via to be connected to the bonding pad; and
forming a second via extending through the first insulating layer, the second conductive layer extends through the second via to be connected to the first conductive layer;
wherein the first insulating layer and the solder bump are formed so that an orthographic projection of the first insulating layer on a plane containing a surface of the integrated circuit substantially covers an orthographic projection of the solder bump on the plane containing the surface of the integrated circuit;
the passivation layer is in direct contact with the bonding pad, in direct contact with second insulating layer, and in direct contact with the first conductive layer;
the under-bump metallization structure is in direct contact with the solder bump and in direct contact with the second conductive layer; and
the second conductive layer is in direct contact with the first insulating layer and in direct contact with the under-bump metallization structure.

\* \* \* \* \*